United States Patent
Kang

(10) Patent No.: US 7,173,868 B2
(45) Date of Patent: Feb. 6, 2007

(54) SENSE AMPLIFIER OF FERROELECTRIC MEMORY DEVICE

(75) Inventor: Hee Bok Kang, Daejeongwangyeok-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/057,191

(22) Filed: Feb. 15, 2005

(65) Prior Publication Data
US 2005/0207250 A1    Sep. 22, 2005

(30) Foreign Application Priority Data
Mar. 22, 2004   (KR)  ............ 10-2004-0019254

(51) Int. Cl.
*G11C 7/02*   (2006.01)
*G11C 11/22*  (2006.01)

(52) U.S. Cl. .................. 365/207; 365/145
(58) Field of Classification Search ........... 365/207, 365/145, 205, 185.13
See application file for complete search history.

(56) References Cited

U.S. PATENT DOCUMENTS

| | | | |
|---|---|---|---|
| 6,023,436 A | * | 2/2000 | Han ............ 365/203 |
| 6,215,692 B1 | * | 4/2001 | Kang .......... 365/145 |
| 6,272,594 B1 | | 8/2001 | Gupta et al. |
| 6,295,223 B1 | * | 9/2001 | Choi et al. ...... 365/145 |
| 6,363,439 B1 | | 3/2002 | Battles et al. |
| 6,888,770 B2 | * | 5/2005 | Ikehashi ...... 365/205 |

FOREIGN PATENT DOCUMENTS

KR    19990080861    11/1999

* cited by examiner

*Primary Examiner*—Anh Phung
(74) *Attorney, Agent, or Firm*—Heller Ehrman LLP

(57) ABSTRACT

A SENSE AMPLIFIER OF FERROELECTRIC MEMORY DEVICE features improvement of the amplification degree. The SENSE AMPLIFIER OF FERROELECTRIC MEMORY DEVICE comprises a MBL sensing unit, a voltage dropping unit, a coupling regulation unit, a pull-down regulation unit, a sensing load unit, and an amplification unit. The level of the sensed voltage is double regulated, thereby improving the amplification degree on low voltage sensing data, and a small sensing voltage of a main bit line can be embodied, thereby embodying a lower voltage memory.

9 Claims, 7 Drawing Sheets

US 7,173,868 B2

SENSE AMPLIFIER OF FERROELECTRIC MEMORY DEVICE

BACKGROUND ART

1. Field of the Invention

The present invention generally relates to a sense amplifier of a nonvolatile ferroelectric memory device, and more specifically, to a sense amplifier which improves amplification by doubly regulating a level of a sensing voltage depending on sensed data.

2. Description of the Prior Art

Generally, a ferroelectric random access memory (hereinafter, referred to as 'FeRAM') has a data processing speed as fast as a Dynamic Random Access Memory (hereinafter, referred to as 'DRAM') and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 1999-14400 by the same inventor of the present invention. Therefore, the basic structure and the operation on the FeRAM are not described herein.

As a chip operating voltage of the FeRAM becomes lower, a cell sensing voltage is reduced, so that it is difficult to embody the rapid operation speed.

When a cell data sensing voltage is small, a voltage margin for detecting timing is also small, so that it is difficult to sense the voltage. As a result, reduction of the sensing margin by generation voltage variation of the timing sensing voltage occurs.

SUMMARY OF THE INVENTION

Accordingly, it is an object of the present invention to provide a nonvolatile ferroelectric memory device which is advantageous in a low voltage operation to improve sensing and amplification efficiency in a sense amplifier by advancing the structure of the sense amplifier.

In an embodiment, a SENSE AMPLIFIER OF FERROELECTRIC MEMORY DEVICE comprises a MBL sensing unit, a voltage dropping unit, a coupling regulation unit, a pull-down regulation unit, a sensing load unit, and an amplification unit. The MBL sensing unit senses and amplifies a voltage of a main bit line when a sensing signal is activated, inverts and amplifies the voltage of the main bit line, and regulates a level of an output voltage depending on the level of the inverted and amplified voltage. The voltage dropping unit drops the level of the voltage inverted and amplified in the MBL sensing unit to a predetermined level. The coupling regulation unit, which is connected in parallel to the voltage dropping unit, transmits a signal inverted and amplified in the MBL sensing unit to an output terminal of the voltage dropping unit. The pull-down regulation unit pulls down output voltages from the voltage dropping unit and the coupling regulation unit when the sensing signal is inactivated. The sensing load unit applies sensing load variably to the MBL sensing unit in response to output signals from the voltage dropping unit and the coupling regulation unit and regulating an output voltage level from the MBL sensing unit. The amplification unit amplifies the output voltage of the MBL sensing unit level-regulated by the MBL sensing unit and the sensing load unit.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
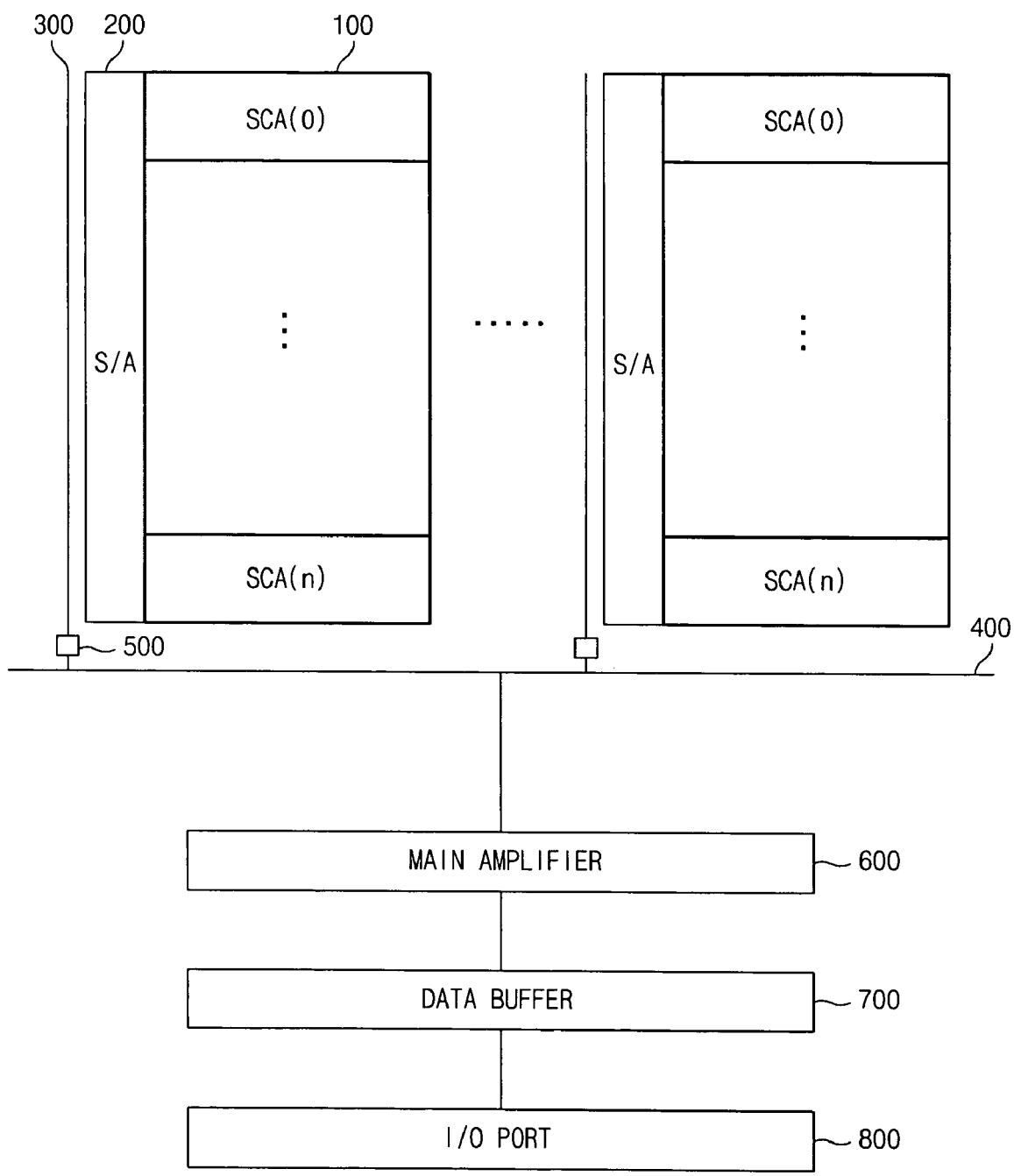
FIG. 1 is a diagram illustrating a nonvolatile ferroelectric memory device according to an embodiment of the present invention.

FIG. 1 is a diagram illustrating a nonvolatile ferroelectric memory device according to an embodiment of the present invention.

In an embodiment, a nonvolatile ferroelectric memory device comprises a plurality of cell array blocks 100, a plurality of sense amplifiers 200, a plurality of local data buses 300, a global data bus 400, a plurality of data bus switches 500, a main amplifier 600, a data buffer 700 and an I/O port 800.

Each of the cell array blocks 100 comprises a plurality of sub cell arrays SCA(0)~SCA(n). Each of the sub cell arrays SCA(0)~SCA(n) comprises a cell array for storing data. Specifically, the cell array block 100 has a multi bit line structure including a plurality of sub bit lines and a main bit line for converting a sensing voltage of the sub bit line into current to induce a main bit line sensing voltage. Here, the plurality of sub bit lines are connected one by one to the plurality of sub cell arrays SCA(0)~SCA(n), and the main bit line is shared by the whole sub cell arrays SCA(0)~SCA(n).

The sense amplifier unit 200 senses and amplifies a sensing voltage of the main bit line to selectively output the sensing voltage to the local data bus 300, and transmits write data applied through the local data bus 300 to the main bit line. The sense amplifier unit 200 is positioned between the cell array block 100 and the local data bus 300 to correspond one by one to the cell array block 100. That is, while a conventional sense amplifier senses cell data applied through a common data bus, the sense amplifier unit 200 according to an embodiment of the present invention directly senses a sensing voltage of the main bit line without passing the common data bus. Each of the sense amplifier units 200 which correspond one by one to main bit lines in the cell array block 100 comprises a plurality of sense amplifiers for sensing and amplifying a voltage of the corresponding main bit line. Each sense amplifier has a sensing load therein, and variably regulates the sensing load depending on the sensed data using the voltage of the main bit line MBL to improve amplification degree of the sense amplifier.

The local data bus 300 transmits a sensing voltage (read data) sensed in the sense amplifier unit 200 to the global data bus 400, and write data applied through the global data bus 400 to the sense amplifier unit 200. The local data bus 300 is located at one side of the sense amplifier unit 200 to correspond one by one to the cell array block 100. The local data bus 300 comprises the predetermined number of bus lines which corresponds to the number of data inputted or outputted to one column selection. Each local data bus 300, connected selectively to the global data bus 400 depending on on/off operation of the data bus switch 500, shares the global data bus 400.

The global data bus 400 transmits read data applied from the local data bus 300 to the main amplifier 600, and write data applied from the main amplifier 600 to the local data bus 300. The global data bus 400 is selectively connected to one of a plurality of local data buses 300 depending on on/off operation of the data bus switch 500.

The main amplifier 600 amplifies read data applied from the global data bus 400 to transmit the amplified read data to the data buffer 700, and amplifies write data applied through the data buffer 700 to transmit the amplifies write data to the global data bus 400.

The data buffer 700 buffers read data to be outputted externally to transmit the buffered read data to the I/O port 800, and buffers write data to be externally inputted through the I/O port 800 to transmit the buffered the write data to the main amplifier 600.

Figure 2:
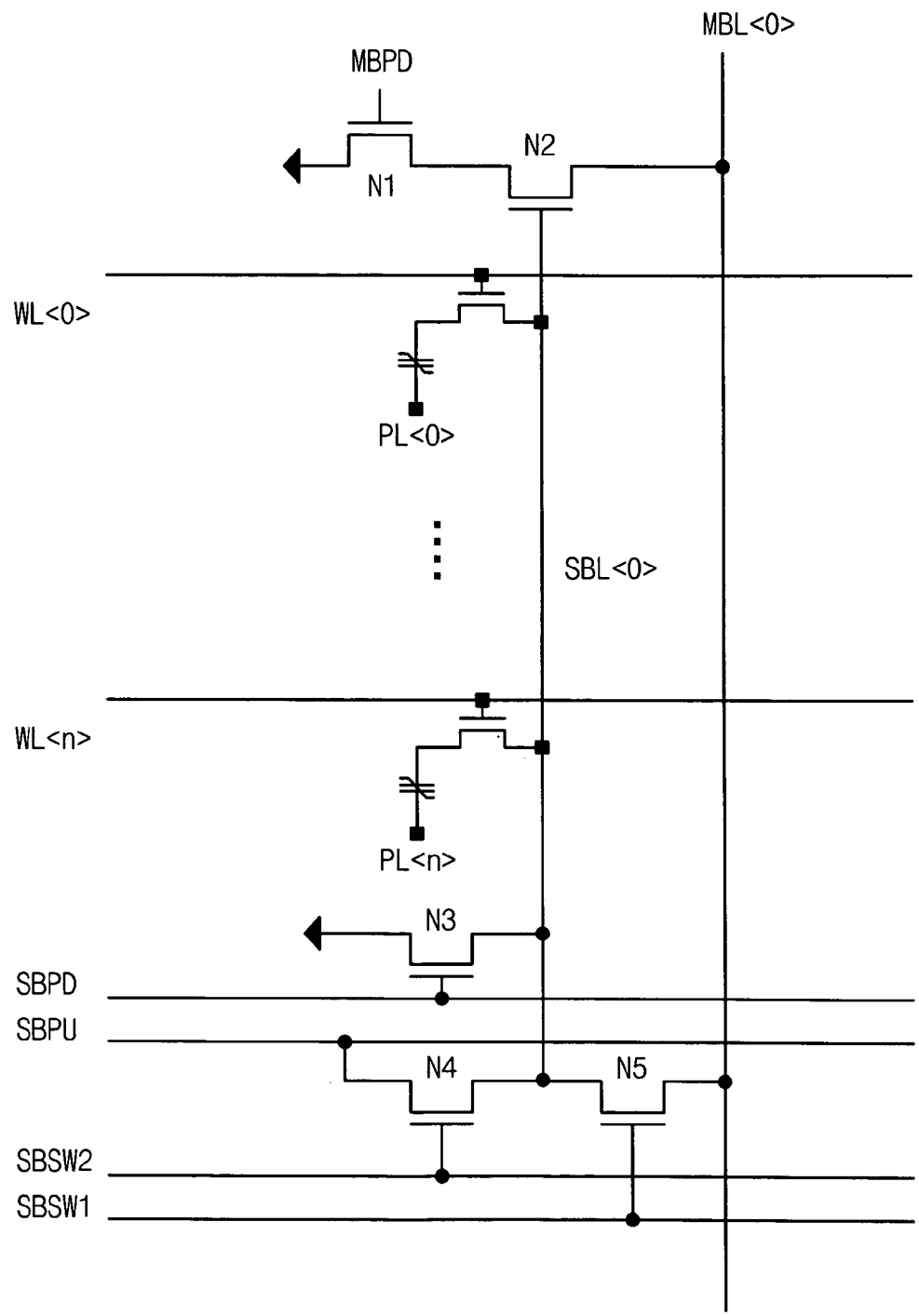
FIG. 2 is a circuit diagram illustrating a unit cell array in a cell array block of FIG. 1.

FIG. 2 is a circuit diagram illustrating one of sub cell arrays SCA(0)~SCA(n) in the cell array block 100 of FIG. 1.

A plurality of sub bit lines SBL are connected in parallel to one main bit line MBL, each of the plurality of sub bit lines SBL are vertically connected, and selectively connected to one sub bit line SBL by one operation. FIG. 2 represents connection of the sub bit line SBL<0> to the main bit line MBL<0> comprised in the sub cell array SCA(0) of the plurality of sub bit lines corresponding to the main bit line MBL<0>.

When a sub bit line selecting signal SBSW1 is activated, a corresponding NMOS transistor N5 is turned on, so that the main bit line MBL<0> has load of one sub bit line. When a sub bit line pull-down signal SBPD is activated to turn on a NMOS transistor N3, the sub bit line SBL<0> is regulated to a ground voltage level.

A sub bit line pull-up signal SBPU is to regulate a power to be supplied to the sub bit line SBL<0>, and a sub bit line selecting signal SBSW2 is to regulate signal flowing between the sub bit line pull-up signal SBPU and the sub bit line SBL<0>.

For example, when a high voltage is required in a low voltage, a voltage higher than a power voltage VCC is supplied to as the sub bit line pull-up signal SBPU. The sub bit line selecting signal SBSW2 is activated to turn on a NMOS transistor N4, a high voltage is supplied to the sub bit line SBL<0>. Then, a plurality of cells are connected to the sub bit line SBL<0>.

A NMOS transistor N1, connected between a ground voltage terminal and a NMOS transistor N2, has a gate to receive a main bit line pull-down signal MBPD. The NMOS transistor N2, connected between the NMOS transistor N1 and the main bit line MBL<0>, has a gate connected to the sub bit line SBL<0>. The NMOS transistor N2 converts a sensing voltage of the sub bit line SBL<0> into current when the main bit line pull-down signal MBPD is activated, and regulates a sensing voltage of the main bit line MBL<0>.

For example, when cell data is 'high', a voltage of the sub bit line SBL<0> becomes higher, so that the amount of current flowing through the NMOS transistor N2 becomes larger to pull down the voltage level of the main bit line MBL<0> to a large extent. On the other hand, when cell data is 'low', the voltage of the sub bit line SBL<0> becomes lower, so that the amount of current flowing through the NMOS transistor N2 becomes smaller to pull down the voltage level of the main bit line MBL<0> in a small extent. In this way, a level difference of the sensing voltage in the main bit line MBL is generated depending on the cell data, and the selected cell data can be sensed by sensing and amplifying the sensing voltage in the sense amplifier unit 200.

Figure 3:
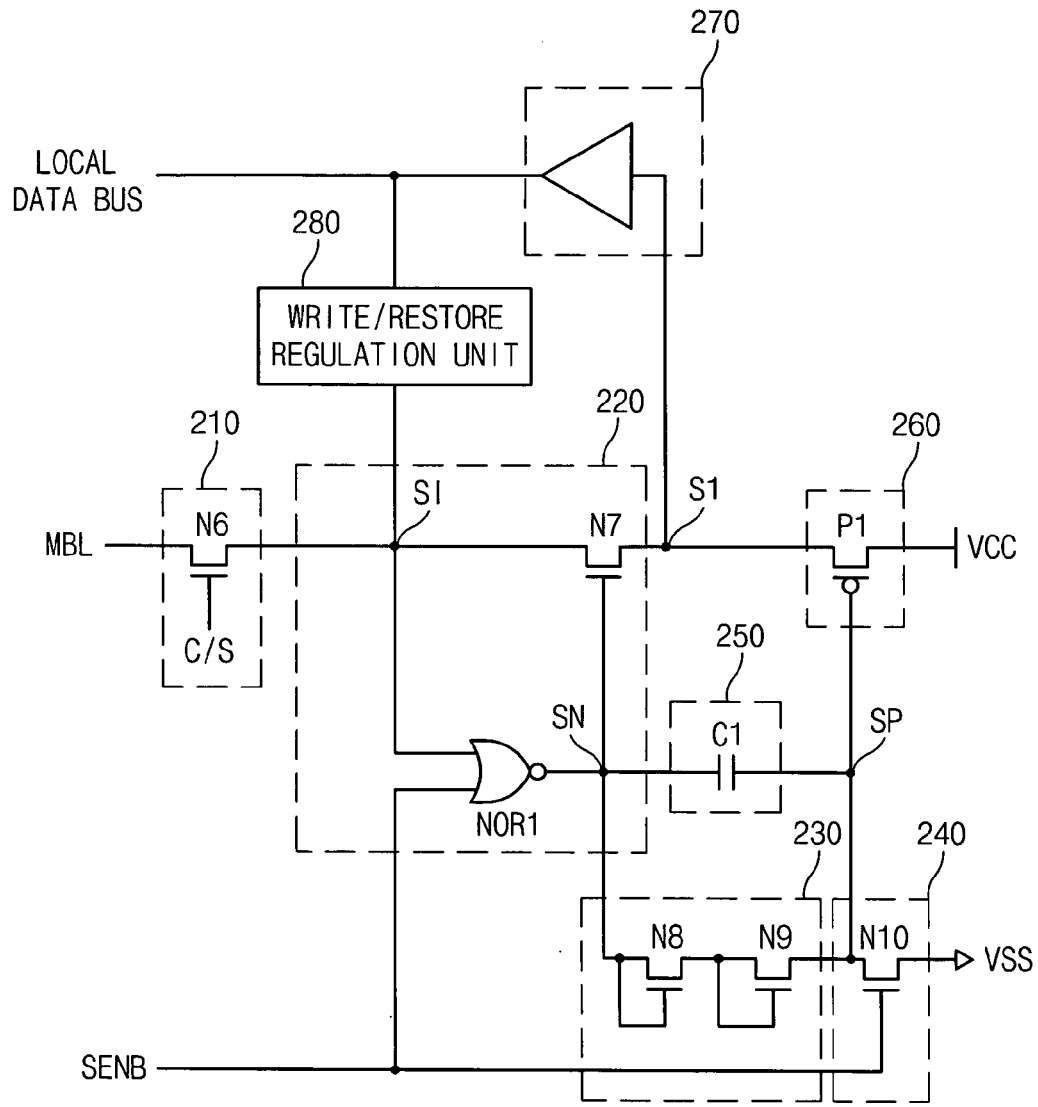
FIG. 3 is a circuit diagram illustrating a sense amplifier according to a first embodiment of the present invention.

FIG. 3 is a circuit diagram illustrating a sense amplifier according to a first embodiment of the present invention.

The sense amplifier of FIG. 3 comprises a column selecting unit 210, a MBL sensing unit 220, a voltage dropping unit 230, a pull-down regulation unit 240, a coupling regulation unit 250, a sensing load unit 260, an amplification unit 270 and a write/restore regulation unit 280.

The column selecting unit 210 connects the MBL sensing unit 220 to the main bit line MBL when a column selecting signal C/S is activated, and applies the voltage of the main bit line MBL to the MBL sensing unit 220. The column selecting unit 210, connected between the main bit line MBL and the MBL sensing unit 220, comprises a NMOS transistor N6 having a gate to receive the column selecting signal C/S.

The MBL sensing unit 220 senses and amplifies the voltage of the main bit line MBL in response to a sensing signal SENB. Here, the MBL sensing unit 220 inverts and amplifies the voltage of the main bit line MBL which is applied through the column selecting unit 210 when the sensing signal SENB is activated to a low level, and variably regulates the amplification degree of the output voltage in response to the inverted and amplified signal. The MBL sensing unit 220 comprises a NOR gate NOR1 and a NMOS transistor N7. The NOR gate NOR1 performs a NOR operation on the sensing signal SENB and a signal of a node SI. The NMOS transistor N7, connected between a node S1 and the node SI, has a gate connected to an output node SN of the NOR gate NOR1.

The voltage dropping unit 230 drops the voltage inverted and amplified in the MBL sensing unit 220 to a predetermined level, and outputs the dropped voltage to the sensing load unit 260. The voltage dropping unit 230 comprises NMOS transistors N8 and N9 which are serially connected between the node SN and a node SP. A gate of the NMOS transistor N8 is connected in common to a drain of the NMOS transistor N9. That is, voltage dropping occurs in the voltage dropping unit 230 by addition (2Vt) of threshold voltages of the NMOS transistors N8 and N9 connected serially. Here, the number of transistors can be regulated depending on a voltage to be dropped although the NMOS transistors N8 and N9 are connected serially in the voltage dropping unit 230.

The pull-down regulation unit 240 pulls down an output signal from the voltage dropping unit 230 to a ground level VSS when the sensing signal SENB is inactivated to a high level. The pull-down regulation unit 240 comprises a NMOS transistor N10 connected between the node SP and the ground voltage terminal. The NMOS transistor N10 has a gate to receive the sensing signal SENB.

The coupling regulation unit 250, connected in parallel to the voltage dropping unit 230, transmits the signal inverted and amplified in the MBL sensing unit 220 to an output terminal of the voltage dropping unit 230. A wavelength of a voltage applied to the sensing load unit 260 has the same pattern as that of the inverted and amplified voltage in the MBL sensing unit 220 on a basis of the voltage level dropped by the voltage dropping unit 230. The coupling regulation unit 250 comprises a capacitor C1 connected between the node SN and the node SP.

The sensing load unit 260 variably applies a sensing load to the MBL sensing unit 220 in response to output signals from the voltage dropping unit 230 and the coupling regulation unit 250, and regulates the amplification degree of the output voltage of the MBL sensing unit 220. The sensing load unit 260 comprises a PMOS transistor P1 connected between a power voltage VCC terminal and the node S1. The PMOS transistor P1 has a gate connected to the node SP. That is, the sensing load unit 260 receives a dropped voltage having the same wavelength as that inverted and amplified voltage in the MBL sensing unit 220, and variably regulates the amount of current flowing from the power voltage VCC to the node S1 to control the sensing load.

As a result, the voltage level of the main bit line MBL is doubly regulated by the MBL sensing unit 220 and the sensing load unit 260, so that a level difference between data 'high' and data 'low' becomes larger than when it is regulated by one of the MBL sensing unit 220 and the sensing load unit 260.

The amplification unit 270 secondly amplifies the voltage which is firstly amplified by the MBL sensing unit 220 and the sensing load unit 260, and outputs the secondly amplified voltage to the local data bus 300.

The write/restore regulation unit 280 transmits write data and read data which are applied to the local data bus 270 to the column selecting unit 210.

Figure 4:
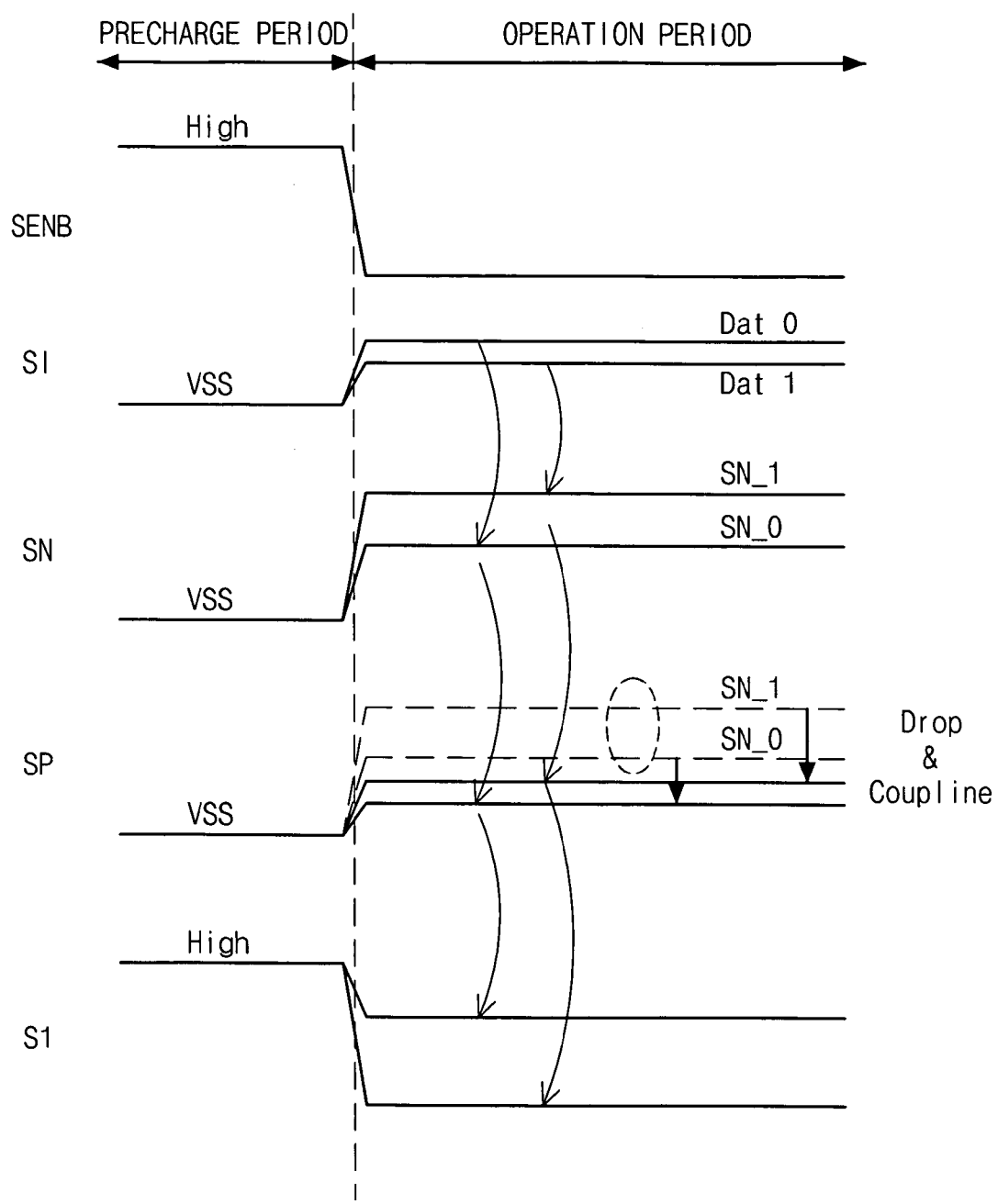
FIG. 4 is a timing diagram illustrating the operation of the sense amplifier of FIG. 3.

FIG. 4 is a timing diagram illustrating the operation of the sense amplifier of FIG. 3.

In a precharge period, the sense signal SENB is inactivated to 'high', and the nodes SI, SN and SP are maintained at a ground voltage VSS level. The sense signal SENB is inactivated to turn on the PMOS transistor P1, so that the node S1 is maintained at a high level.

When the column selecting signal C/S and the sensing signal SENB are activated for the sensing operation, the MBL sensing unit 220 inverts and amplifies the voltage applied to the node SI through the column selecting unit 210, and outputs the inverted and amplified voltage to the node SN.

A voltage of the node SN is applied to the gate of the NMOS transistor N7, and the amplification degree of the voltage sensed in the MBL sensing unit 220 is regulated. That is, the voltage of the node SN is applied to the gate of the NMOS transistor N7, which is turned on. However, since the voltage of the node SN has the level difference depending on the sensed data "0" or "1", channel resistance of the NMOS transistor N7 is varied depending on the sensed data "0" or "1". As a result, because the amount of current flowing from the node S1 to the node SI is varied, and the voltage level of the node S1 is regulated to be varied depending on the sensed data.

The voltage of the node SN is applied to the coupling regulation unit 250 and the voltage dropping unit 230. The coupling regulation unit 250 transmits the voltage of the node SN to the node SP. Here, the voltage transmitted to the node SP is kept to have the same wavelength as that of the node SN by the coupling regulation unit 250. However, the voltage level of the node SN is dropped by a predetermined level (2Vt) by the voltage dropping unit 230.

The voltage level of the node SP has a difference depending on the sense data like in the node SN, so that the channel resistance of the PMOS transistor P1 is varied. As a result, the amount of current supplied from the power voltage VCC to the node S1 is varied depending on the sensed data, so that the voltage level of the node S1 is regulated.

Accordingly, in the sense amplifier according to an embodiment of the present invention, the voltage applied to the gate of the NMOS transistor N7 and its wavelength are identically maintained. However, the voltage having the dropped level is applied to the gate of the PMOS transistor P1, thereby double regulating the voltage level of the node S1. As a result, the voltage difference between the data 'high' and the data 'low' is largely generated as shown in FIG. 4.

Figure 5:
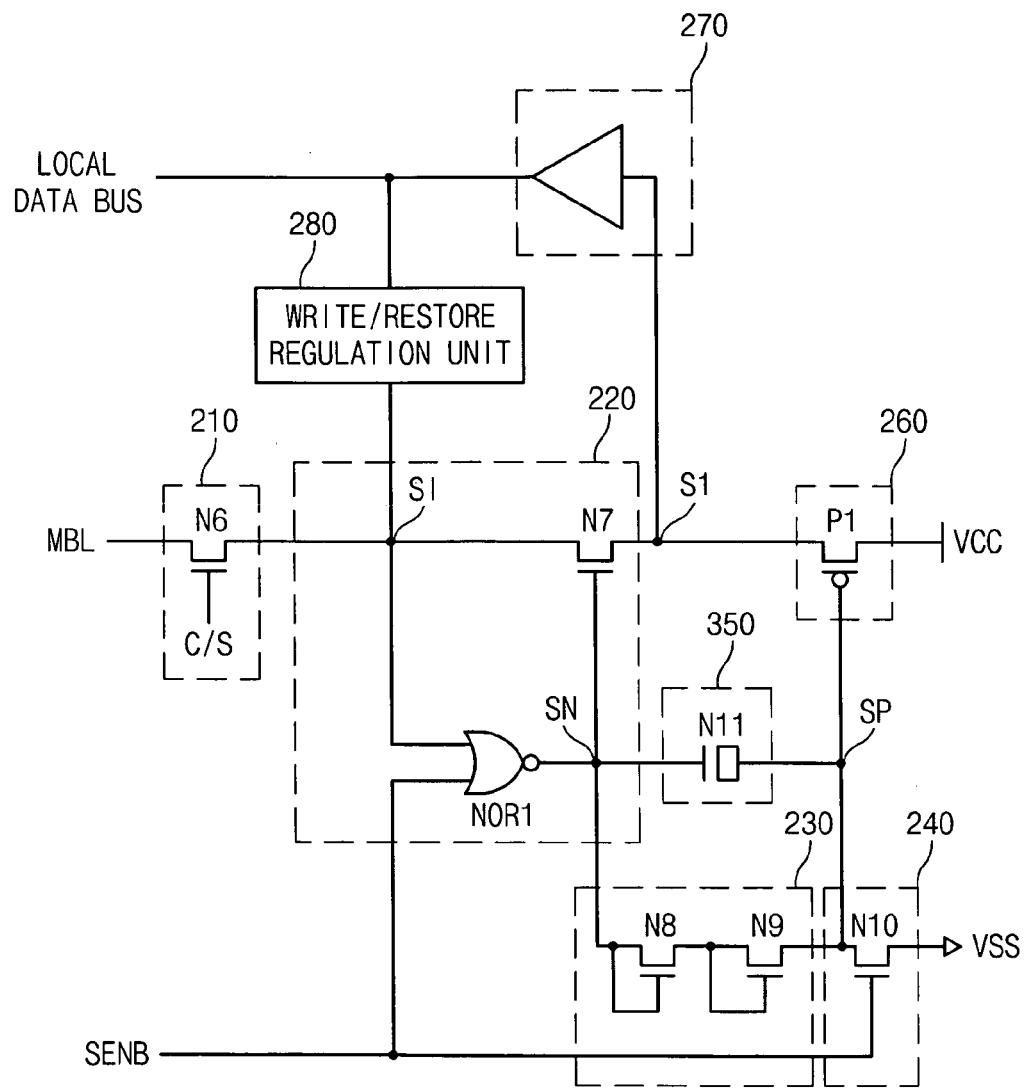
FIG. 5 is a circuit diagram illustrating a sense amplifier according to a second embodiment of the present invention.

FIG. 5 is a circuit diagram illustrating a sense amplifier according to a second embodiment of the present invention.

The same function and operation principle of that of FIG. 3 are applicable to the sense amplifier of FIG. 5 except in that the coupling regulation unit 350 comprises a NMOS transistor N11. Therefore, the same reference number is used except the coupling regulation unit 350, and the explanation on the operation of the sense amplifier according to an embodiment of the present invention is omitted.

Figure 6:
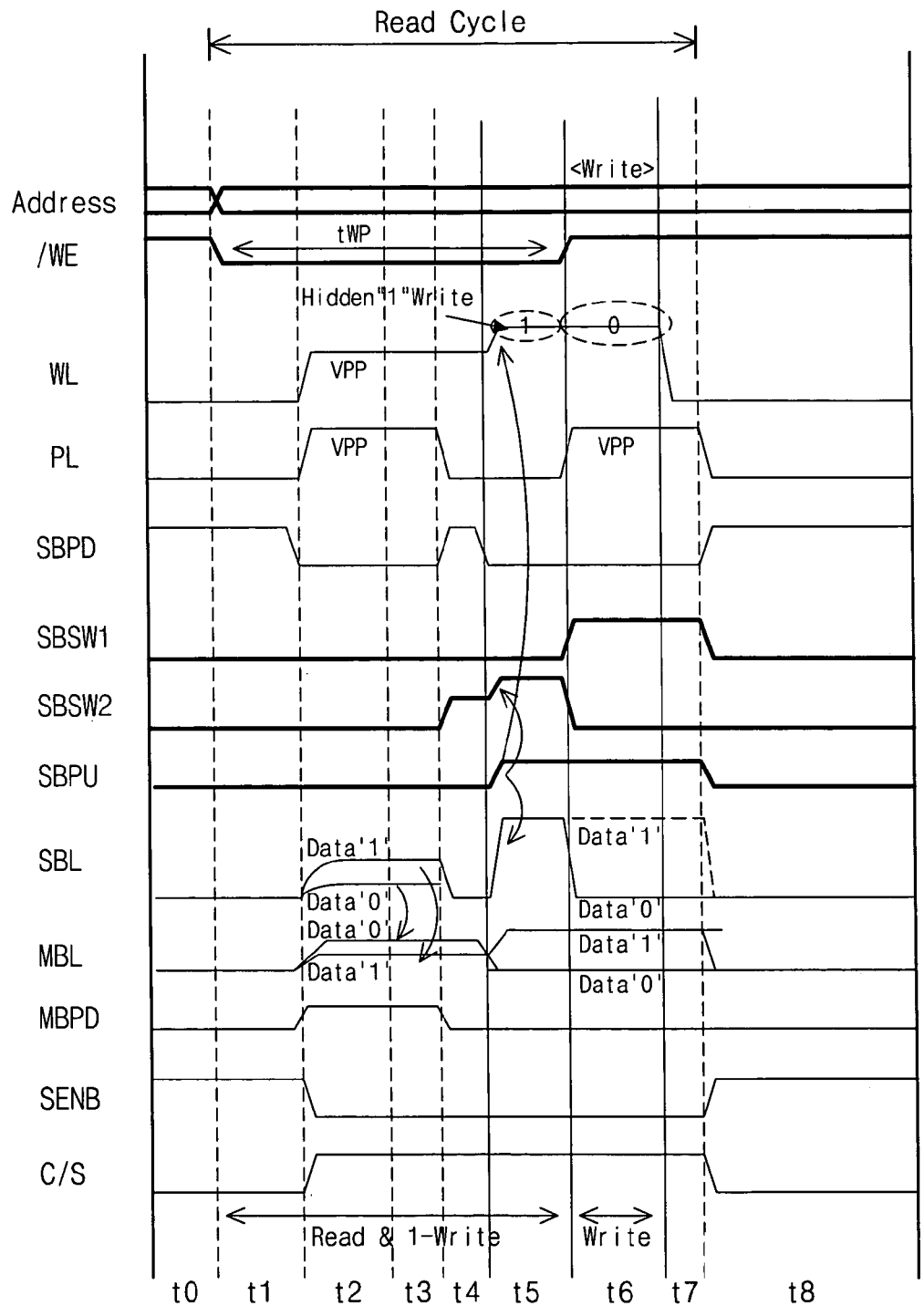
FIG. 6 is a timing diagram illustrating the write operation of the nonvolatile ferroelectric memory device according to an embodiment of the present invention.

FIG. 6 is a timing diagram illustrating the write operation of the nonvolatile ferroelectric memory device according to an embodiment of the present invention.

In a period t1, when an address transits and a write enable signal /WE is inactivated to 'low', the operation becomes at a write mode active state.

Before the word line WL is activated, the main bit line MBL and the sub bit line SBL are pulled down.

In periods t2 and t3, data are sensed. In the period t2, when the word line WL and a plate line PL are enabled to 'high', data of a cell selected by the enabled word line WL are applied to the sub bit line SBL. When cell data are applied to the sub bit line SBL while the main bit line pull-down signal MBPD is activated, the NMOS transistor N2 is turned on to induce a sensing voltage to the main bit line MBL. Then, the sensing voltage induced to the main bit line MBL is applied to the sense amplifier unit 200 in response to activation of the column selecting signal C/S.

When the sensing signal SENB is activated, the corresponding sense amplifier of the sense amplifier unit 200 senses and amplifies the voltage of the main bit line MBL as shown in FIG. 4, and outputs the sensed and amplified voltage to the local data bus 300.

In a period t4, when a voltage of the plate line PL is inactivated to 'low' and the sub bit line pull-down signal SBPD is activated to 'high', the sub bit line SBL is regulated to the ground level.

Next, in a period t5, when the sub bit line pull-up signal SBPU is activated, high data (Hidden "1") are written to all cells connected to the driven word line WL regardless of external data.

In a period t6, the write enable signal /WE is activated to 'high', so that data are written. That is, the voltages of the word line WL and the plate line PL are changed to a pumping level, and the write data applied to the local data bus 300 are applied to the main bit line MBL through the column selecting unit 210 by the write/restore regulation unit 280. The write data applied to the main bit line MBL are applied to the sub bit line SBL in response to activation of a sub bit line selecting signal SBSW1, and written to the cell. Here, data written in the period t5 is maintained as it is when data of the sub bit line SBL are 'high', while the low data are written in the corresponding cell when the data of the sub bit line SBL are 'low'.

After data are written, the word line WL is inactivated for a predetermined time earlier than the plate line PL.

Figure 7:
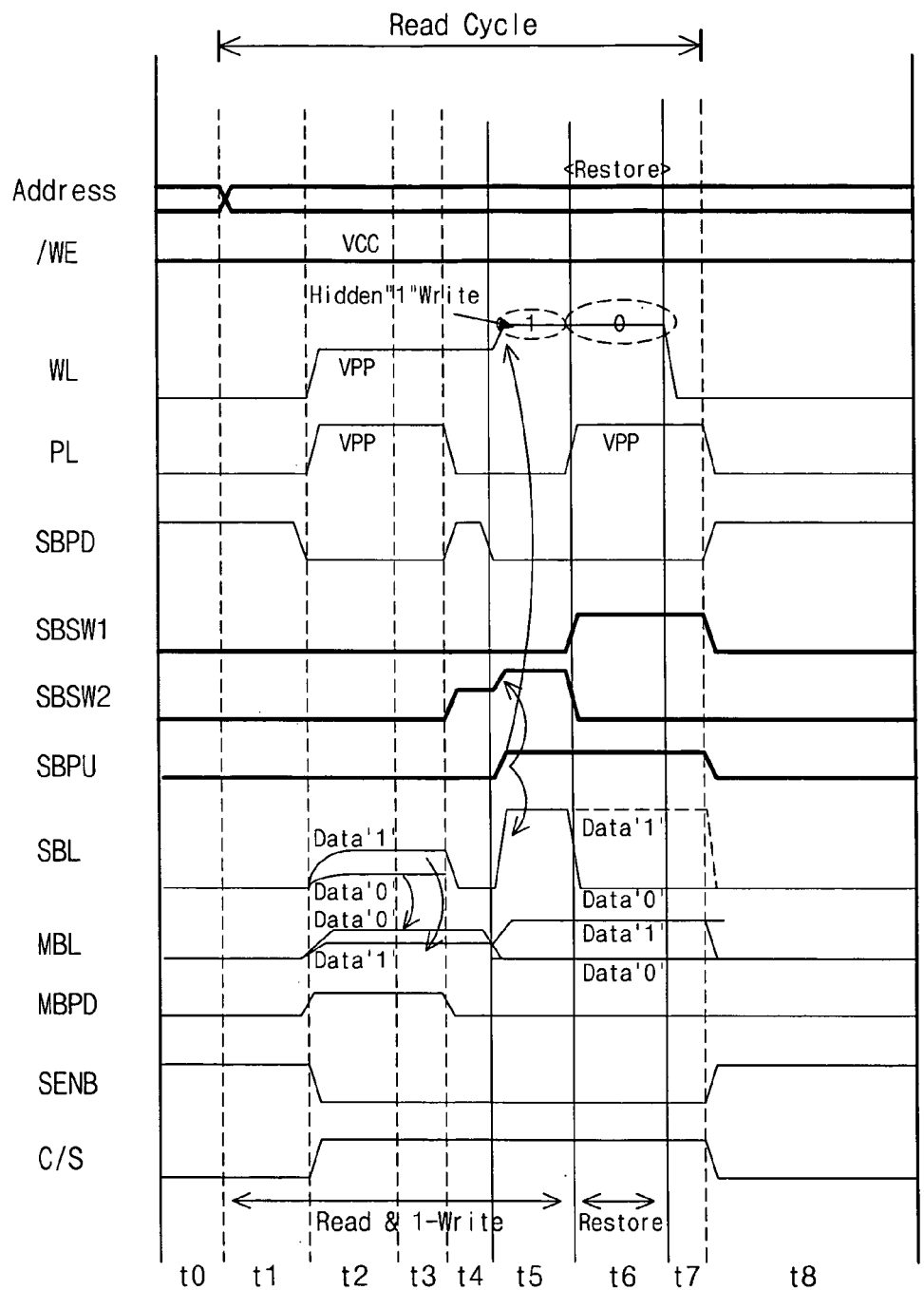
FIG. 7 is a timing diagram illustrating the read operation of the nonvolatile ferroelectric memory device according to an embodiment of the present invention.

FIG. 7 is a timing diagram illustrating the read operation of the nonvolatile ferroelectric memory device according to an embodiment of the present invention.

In a read mode, the write enable signal /WE is maintained at the power voltage VCC level.

The same procedure for sensing and amplifying cell data and writing hidden data "1" in the corresponding cell as shown in FIG. 6 is also applicable to the periods t0~t5 of FIG. 7.

After the sensing and amplification are completed, an output signal (read data) of the amplification unit 270 is applied again to the main bit line MBL through the write/restore regulation unit 280 and the column selecting unit 210.

In a period t6, when the voltages of the word line WL and the plate line PL are changed to the pumping level and the sub bit line selecting signal SBSW1 is activated, the read data applied to the main bit line MBL is applied to the sub bit line SBL, and written to the cell. Here, when the data of the sub bit line SBL is 'high', the data written in the period t5 is maintained as it is, and low data are written when the data of the sub bit line SBL are 'low'. As a result, the period t6 becomes a restore period where the internally sensed and amplified data are re-written in the cell.

After the restore operation is completed, the word line WL is inactivated for a predetermined time earlier than the plate line PL.

As described above, a SENSE AMPLIFIER OF FERROELECTRIC MEMORY DEVICE according to an embodiment of the present invention improves the amplification degree on sensing data by double regulating levels of sensed data to have a small sensing voltage of a main bit line. As a result, a low voltage memory can be embodied, and cross talk noise between main bit lines can be reduced.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A sense amplifier of a ferroelectric memory device comprising:
   a MBL sensing unit for sensing and amplifying a voltage of a main bit line when a sensing signal is activated, inverting and amplifying the voltage of the main bit line, and regulating a level of an output voltage depending on the level of the inverted and amplified voltage;
   a voltage dropping unit for dropping the level of the inverted and amplified voltage in the MBL sensing unit to a predetermined level;
   a coupling regulation unit, connected in parallel to the voltage dropping unit, for transmitting a signal inverted and amplified in the MBL sensing unit to an output terminal of the voltage dropping unit;
   a pull-down regulation unit for pulling down output voltages from the voltage dropping unit and the coupling regulation unit when the sensing signal is inactivated;
   a sensing load unit for applying sensing load variably to the MBL sensing unit in response to output signals from the voltage dropping unit and the coupling regulation unit and regulating an output voltage level from the MBL sensing unit; and
   an amplification unit for amplifying the output voltage of the MBL sensing unit level-regulated by the MBL sensing unit and the sensing load unit.

2. The sense amplifier of a ferroelectric memory device according to claim 1, further comprising:
   a column selecting unit for transmitting the voltage of the main bit line to the MBL sensing unit in response to a column selecting signal; and
   a write/restore regulation unit for transmitting write/read data applied to the data bus to the column selecting unit.

3. The sense amplifier of a ferroelectric memory device according to claim 1, wherein the MBL sensing unit varies channel resistance of a switching means connected between an input node to receive the voltage of the main bit line depending on the level of the inverted and amplified voltage and a node where the output voltage is outputted, and regulates the level of the output voltage.

4. The sense amplifier of a ferroelectric memory device according to claim 3, wherein the sensing load unit varies channel resistance of a switching means connected between a power voltage terminal and an output node of the MBL sensing unit in response to output signals from the voltage dropping unit and the coupling regulation unit, and applies the sensing load variably.

5. The sense amplifier of a ferroelectric memory device according to claim 2, wherein the MBL sensing unit varies channel resistance of a switching means connected between an input node to receive the voltage of the main bit line depending on the level of the inverted and amplified voltage and a node where the output voltage is outputted, and regulates the level of the output voltage.

6. The sense amplifier of a ferroelectric memory device according to claim 5, wherein the sensing load unit varies channel resistance of a switching means connected between a power voltage terminal and an output node of the MBL sensing unit in response to output signals from the voltage dropping unit and the coupling regulation unit, and applies the sensing load variably.

7. The sense amplifier of a ferroelectric memory device according to claim 1, wherein the voltage dropping unit drops the inverted and amplified voltage level by addition of threshold voltages of MOS transistors connected serially.

8. The sense amplifier of a ferroelectric memory device according to claim 1, wherein the coupling regulation unit transmits a signal having the same wavelength as that of the inverted and amplified signal.

9. The sense amplifier of a ferroelectric memory device according to claim 8, wherein the coupling regulation unit is a capacitor.

* * * * *